United States Patent
Meng et al.

(10) Patent No.: US 8,013,957 B2
(45) Date of Patent: Sep. 6, 2011

(54) TRANSFLECTIVE LIQUID CRYSTAL DEVICE AND METHOD OF MANUFACTURING THE SAME

(75) Inventors: Zhiguo Meng, Hong Kong (CN); Man Wong, Hong Kong (CN); Hoi Sing Kwok, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 829 days.

(21) Appl. No.: 11/915,120

(22) PCT Filed: May 21, 2005

(86) PCT No.: PCT/SG2005/000157
§ 371 (c)(1),
(2), (4) Date: Nov. 20, 2007

(87) PCT Pub. No.: WO2006/126968
PCT Pub. Date: Nov. 30, 2006

(65) Prior Publication Data
US 2008/0204620 A1     Aug. 28, 2008

(51) Int. Cl.
*G02F 1/1368* (2006.01)
*G02F 1/1343* (2006.01)
*H01L 21/70* (2006.01)
(52) U.S. Cl. ............. 349/114; 349/43; 257/72; 438/30
(58) Field of Classification Search .......... 349/42, 349/43, 113, 114, 139, 143, 187; 257/72, 257/E21.535; 438/30; 345/92
See application file for complete search history.

(56) References Cited

U.S. PATENT DOCUMENTS

| | | | |
|---|---|---|---|
| 5,191,453 A | 3/1993 | Okumura | |
| 5,245,452 A * | 9/1993 | Nakamura et al. | 349/140 |
| 5,471,330 A | 11/1995 | Sarma | |
| 5,675,177 A | 10/1997 | Abys et al. | |
| 5,705,829 A | 1/1998 | Miyanaga et al. | |
| 5,750,017 A | 5/1998 | Zhang | |
| 5,893,730 A | 4/1999 | Yamazaki et al. | |
| 5,990,560 A | 11/1999 | Coult et al. | |
| 6,452,258 B1 | 9/2002 | Abys et al. | |
| 6,697,138 B2 | 2/2004 | Ha et al. | |
| 6,737,674 B2 | 5/2004 | Zhang et al. | |
| 6,822,263 B2 | 11/2004 | Satou et al. | |
| 6,828,585 B2 | 12/2004 | Ueda | |

(Continued)

FOREIGN PATENT DOCUMENTS

JP      6342172      12/1994

OTHER PUBLICATIONS

Hara, A. et al., "Selective Single-Crystalline-Silicon Growth at the Pre-defined Active Regions of TFTs on a Glass by a Scanning CW Laser Irradiation," IEEE IEDM'00, 2000, pp. 209-212.

(Continued)

*Primary Examiner* — David Nelms
*Assistant Examiner* — Tai Duong
(74) *Attorney, Agent, or Firm* — Ella Cheong Hong Kong; Margaret Burke; Sam Yip

(57) ABSTRACT

The construction of electrodes for liquid-crystal displays using larger grain lower absorption (LGLA) poly-Si showing an absorptivity below 20% in the visible light region is described. Integration in the manufacturing of substrates for active-matrix LCDs is shown. Source, drain and channel region (108b, 108c, 108d) of the TFTs as well as the pixel-electrode (108e) are formed conjointly in a single poly-Si layer.

30 Claims, 5 Drawing Sheets

U.S. PATENT DOCUMENTS

| | | | |
|---|---|---|---|
| 6,831,718 | B2 | 12/2004 | Wei et al. |
| 6,853,421 | B2 | 2/2005 | Sakamoto et al. |
| 6,864,130 | B2 | 3/2005 | Koo et al. |
| 2003/0037843 | A1* | 2/2003 | Hishida .......................... 148/284 |
| 2003/0129853 | A1 | 7/2003 | Nakajima et al. |
| 2004/0021813 | A1 | 2/2004 | Kim et al. |
| 2004/0061817 | A1 | 4/2004 | Maeda |
| 2004/0085498 | A1 | 5/2004 | Chang |
| 2004/0090574 | A1 | 5/2004 | Tanada et al. |
| 2004/0090576 | A1 | 5/2004 | Chuang |
| 2005/0213002 | A1* | 9/2005 | Wen et al. ..................... 349/114 |
| 2006/0103299 | A1* | 5/2006 | Kwok et al. .................. 313/506 |

OTHER PUBLICATIONS

Jong Hyun Choi et al., "Giant-Grain Silicon (GGS) and its Application to Stable Thin-Film Transistor" IDMC 2005, pp. 137-142.

Kubo, N. et al., "Characteristics of Polycrystalline-Si Thin Film Transistors Fabricated by Excimer Laser Annealing Method", IEEE Transactions on Electron Devices, vol. 41, No. 10, Oct. 1994, pp. 1876-1879.

Mizuki, T. et al., "Large Domains of Continuous Grain Silicon on Glass Substrate for High-Performance TFTs", IEEE Transactions on Electron Devices vol. 51, No. 2, Feb. 2004. pp. 204-211.

Jin, Z. et al., "Nickel Induced Crystallization of Amorphous Silicon Thin Film", Journal of Applied Physics, vol. 84, No. 1, 1998, pp. 194-200.

Meng, Z. et al., "High Performance Low Temperature Metal-Induced Unilaterally Crystallized Polycrystalline Silicon Thin Film Transistors for System-on-panel Applications", IEEE Transactions on Electron Devices, vol. 47, No. 2, Feb. 2000, pp. 404-409.

* cited by examiner

Pior Art

TRANSFLECTIVE LIQUID CRYSTAL DEVICE AND METHOD OF MANUFACTURING THE SAME

FIELD OF INVENTION

The present invention relates to a liquid crystal display (LCD) and method for manufacturing the same, and more particularly to, a transflective active-matrix type LCD.

BACKGROUND OF THE INVENTION

LCD devices can generally be classified into two types depending on the type of the light source used. One is a transmissive LCD device and the other is a reflective LCD device. The transmissive LCD device displays a color image by irradiating artificial light from a back light, which is positioned behind a liquid crystal panel. The other is a reflective LCD device which displays a color image by controlling a transmittance of the light according to an alignment of the liquid crystal by reflecting ambient light or artificial light. Because the transmissive LCD device uses an artificial light source such as the back light, it can display a bright image in dark surroundings but it has a high power consumption. The reflective LCD device depends on ambient light or an external artificial light source for its light source and accordingly it has lower power consumption than the transmissive LCD device but it is not suitable for dark surroundings. A third type, the transflective LCD device, which has characteristics of both the transmissive and reflective LCD device, has been suggested as a combination of the first two types.

However, there exist drawbacks of the transflective LCD device. For example, its manufacturing steps are complicated. Transflective electrodes are usually formed by partially covering thin metallic film (reflective electrode) on an indium-tin oxide (ITO) layer (transmissive electrode). Integration of such electrodes requires extra processing steps that usually lead to poor yield.

FIG. 8 illustrates the structure of a conventional active-matrix transflective liquid crystal display device. An insulating substrate 801 is provided, on top of which is deposited a buffer layer 802. An active layer of a thin-film transistor (TFT) comprising electrode regions 807 and 809, and a channel region 808 are formed within the polycrystalline silicon layer. The gate oxide layer 803 is formed on and covered the active regions (807, 808 and 809). Two insulation layers 804a and 804b made of low-temperature oxide (LTO) are formed on the gate oxide layer 803. A gate electrode 810 of the TFT is formed on the gate oxide layer 803 and buried within the first insulation layer 804a. A transparent electrode 806 made of indium tin oxide (ITO) is formed at the location as illustrated. The transparent electrode 806 is electrically connected to one electrode region 809 of the TFT via a metal electrode 805 made of aluminum.

SUMMARY OF INVENTION

It is an object of the present invention to substantially overcome or at least ameliorate one or more of the above-mentioned drawbacks such as complicated manufacturing steps.

Indium tin oxide (ITO) was conventionally used as the material for pixel electrode in transflective LCD device due to its transparent and conductive properties. ITO suitable for this purpose usually visible light absorption of 10-20%, and sheet resistance of 0.01-0.1 KΩ/square. The inventors discovered that some kinds of polycrystalline silicon (poly-Si) that have larger grain size and lower visible light absorption are highly desirable for constructing a transflective LDC display. Particularly, the material can be used to form a pixel electrode in a transflective LCD display. The same material can also be used to form the electrode region of the TFT in the transflective LCD display. In manufacturing the transflective LCD device, the pixel electrode and the TFT electrode may be formed in the same poly-Si layer, which leads to a simplified manufacturing process.

According to one aspect of the present invention, a liquid crystal display device is provided, which comprises:
  a. a first substrate;
  b. a second substrate arranged facing said first substrate with a gap therebetween;
  c. a liquid crystal layer sandwiched in the gap between the first and second substrates;
  d. a partially doped semiconductive poly-Si layer formed on said first substrate, in which a pixel electrode and a portion of a TFT are formed;
  wherein said pixel electrode is electrically connected to said portion of the TFT, and wherein said poly-Si has a grain size of 0.5-1000 μm, a sheet resistance of 0.01-1KΩ/square, and an average absorptivity lower than 20% in the visible light region. The portion of the TFT may comprise the electrode region(s) of the TFT.

In a preferred embodiment, the poly-Si has a grain size of 0.5-50 μm, an average absorptivity of 5-20%, and a sheet resistance of 0.1-1 KΩ/square.

In another preferred embodiment, the poly-Si is selected from a group consisting of MIC, MILC, MICC, and laser-induced crystallization poly-Si.

In another preferred embodiment, the portion of the TFT comprises two electrode regions of the TFT. Preferably, the active layer further comprises a channel region formed between the two electrode regions. More preferably, the pixel electrode is unitarily formed with one of the electrode regions of the TFT.

In another preferred embodiment, the partially doped poly-Si comprises a doped region and an un-doped region, wherein said pixel electrode and said electrode regions being formed in the doped region and said channel region being formed in the un-doped region. Preferably, the doped region comprises a resistance-reducing impurity selected from a group consisting of boron, phosphorous, and arsenic.

In another preferred embodiment, the liquid crystal display further comprises:
  a. an insulation layer disposed on the poly-Si layer;
  b. a gate electrode formed above the channel region in the insulation layer;
  c. a metal electrode electrically connected to the active layer of the TFT.

In a preferred embodiment, the metal electrode is connected to one of the electrode regions of the TFT. In another preferred embodiment, the insulation layer is made of low-temperature oxide and said metal electrode is made of aluminum.

According to another aspect of the present invention, a process of making a liquid crystal device is provided, which comprises:
  a. providing a substrate;
  b. depositing an amorphous silicon layer on the substrate;
  c. forming a poly-Si layer from said amorphous silicon layer, said poly-Si having a grain size of about 0.5-1000 μm, an average absorptivity lower than 20% in the visible light region, and a sheet resistance of 0.01-1 KΩ/square;

d. partially doping the poly-Si layer, forming a doped region and an un-doped region;
e. forming a portion of a TFT and a pixel electrode in the doped region of the poly-Si layer;

In a preferred embodiment, said poly-Si has a grain size of 0.5-50 μm, an average absorptivity of 5-20%, and a sheet resistance of 0.1-1 KΩ/square.

In a preferred embodiment, the poly-Si is formed by a crystallization method selected from MIC, MILC, MICC, and laser-induced crystallization method.

In another preferred embodiment, the MILC method comprises:
  i. depositing a patterned masking layer on said amorphous silicon layer;
  ii. depositing crystallization-inducing metal on said masking layer;
  iii. crystallizing said amorphous silicon layer, forming metal-induced crystallized (MIC) and MILC poly-Si;
  iv. removing said MIC poly-Si and masking layer.

Preferably, the doping in step d. comprising
  i. adding a dopant to a portion of the poly-Si;
  ii. activating said dopant by heating at a temperature of 450-620° C., forming a doped region and an un-doped region.

Preferably, step e. comprises forming an electrode region in the doped region and forming a channel region in the un-doped poly-Si region.

In yet another preferred embodiment, the process further comprises depositing a buffer layer on said substrate before depositing the amorphous silicon layer. Preferably, the amorphous silicon layer, buffer layer and patterned masking layer are deposited via a method selected from a group consisting of LPCVD, PEVCVD, and sputtering. Preferably, the buffer layer is made of $SiO_2$ or $SiN_x$.

In another preferred embodiment, the crystallization-inducing metal is deposited via a method selected from a group consisting of e-beam, sputtering, or immersion in a solution. Preferably, the crystallization-inducing metal is selected from a group consisting of Ni, NiSix, Ni(OH)x, NiOx, and Nickel salts.

In another preferred embodiment, the crystallization method comprises an annealing step selected from a group consisting of laser annealing, high-temperature annealing (>6000), annealing from 350-600° C., and annealing in $N_2$.

In another preferred embodiment, the dopant is added via ion implantation or ion shower. Preferably, the dopant is a resistance-reducing impurity selected from a group consisting of boron, arsenic, and phosphorous.

According to yet another aspect of the present invention, a liquid crystal display device is provided, which comprises:
  a. a first substrate, a second substrate comprising and a liquid crystal layer provided between inner surfaces of the first and the second substrates,
  b. a plurality of pixel regions and a plurality of switching elements on the first substrate, each of the pixel regions comprising a reflective region and a transflective region, wherein the transflective region comprises a transflective electrode formed at a location corresponding to the transflective region of each pixel region, and the reflective region comprises
    i. a mirror for performing display using reflected light;
    ii. a reflection electrode electrically connected to the transmission electrode;
    iii. pixels of red, green, and blue colors, wherein the pixel color being controlled by adjusting the area of the mirror;

wherein at least one of the transflective electrode and the reflection electrode being electrically connected to the switching element and wherein said transflective electrode is made of poly-Si; said poly-Si having a grain size of 0.5-1000 μm, an average absorptivity lower than 20%, and a sheet resistance of 0.01-1 KΩ/square.

In a preferred embodiment, the poly-Si has a grain size of 0.5-50 μm, an average absorptivity lower than 10-20%, and a sheet resistance of 0.1-1 KΩ/square. In another preferred embodiment, the poly-Si is selected from a group consisting of MILC, MIC, MICC, and laser-induced crystallized poly-Si.

In another preferred embodiment, the poly-Si is doped with a resistance-reducing impurity selected from a group consisting of boron, arsenic, and phosphorous.

According to yet another aspect of the present invention, a liquid crystal display device is provided, which is made by
  a. forming a partially doped poly-Si layer on a substrate, said poly-Si having a grain size of about 0.5-1000 μm, average absorptivity lower than 20% in the visible light region, and a sheet resistance of 0.01-1 KΩ/square;
  b. forming an electrode region of a TFT and a pixel electrode in the partially doped poly-Si layer.

In a preferred embodiment, the poly-Si has a grain size of about 0.5-50 μm, an average absorptivity lower than 10-20%, and sheet resistance of 0.1-1 KΩ/square.

DETAILED DESCRIPTION

"Larger grain" may be considered as poly-Si having grain sizes in the range of about 0.5-1,000 μm. Preferably the grain sizes are in the range of 1-900 μm, 5-800 μm, 10-700 μm, 15-600 μm, or 20-500 μm, 25-400 μm, 30-300 μm, 35-200 μm, and 40-100 μm. In specific implementation as described below, the grain sizes are in an average of 50 μm has been achieved "Lower absorption" may be considered as poly-Si having absorption in the visible light region being lower than 20%. Preferably the absorption is lower than 15%, 10%, 5%, and 1%. In specific implementation as described below, the absorption in an average of 10% has been achieved.

Larger-grain lower absorption (LGLA) poly-Si could be made via, but not limited to the following methods: metal-induced crystallization of amorphous silicon, (MIC), metal-induced laterally crystallization of amorphous silicon (MILC), metal-induced crystallization of amorphous silicon using a cap layer (MICC), laser-induced crystallization of amorphous silicon. The following description demonstrates the manufacturing of LGLA poly-Si film via MILC method and the manufacturing of pixel electrode and TFT of a transflective LCD device as one embodiment of the present invention.

Figure 1:
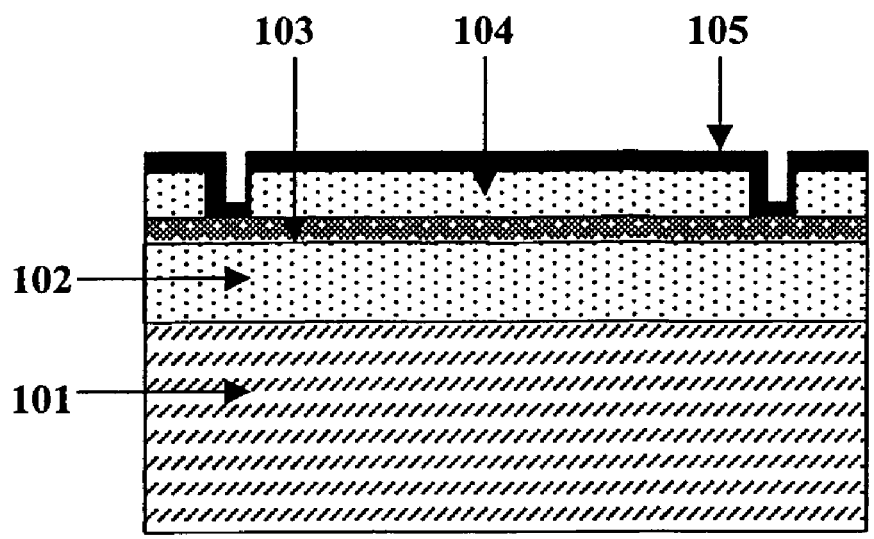
FIG. 1 is a schematic diagram showing the cross-section of a portion of a transflective LCD device in an initial stage during the manufacturing process.

FIGS. 1-5 illustrate a transflective liquid crystal display device and the method of manufacturing the same. Referring to FIG. 1, an insulating substrate 101 such as glass or quartz is provided. A buffer layer 102 made of SiOx or SiNx is then formed on the insulating substrate 101, with an amorphous silicon layer 103 being deposited on the buffer layer 102. A patterned masking layer 104 is then deposited on the amorphous silicon layer 103. A nickel (Ni) thin film 105 is then deposited on the patterned masking layer 104 as a catalyst for crystallization.

Figure 2:
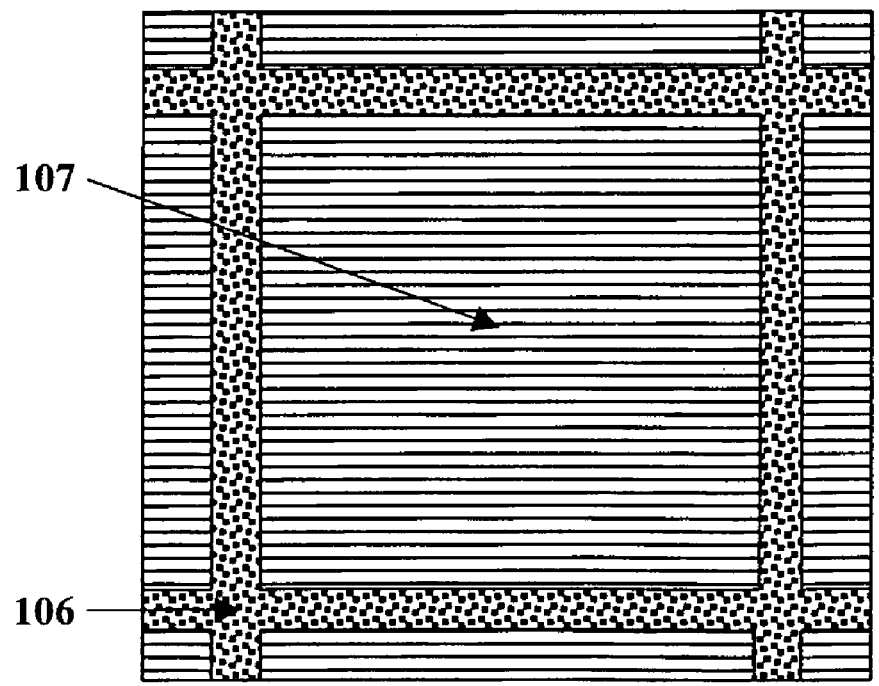
FIG. 2 is a schematic diagram showing the plan-view of the crystallized poly-silicon layer during the process of manufacturing a transflective LCD device.

Thereafter, a thermal process is carried out, resulting, as illustrate in FIG. 2, a vertically crystallized poly-Si region 106 and a laterally crystallized (MILC) poly-Si region 107 being formed in the amorphous silicon layer 103.

Figure 3:
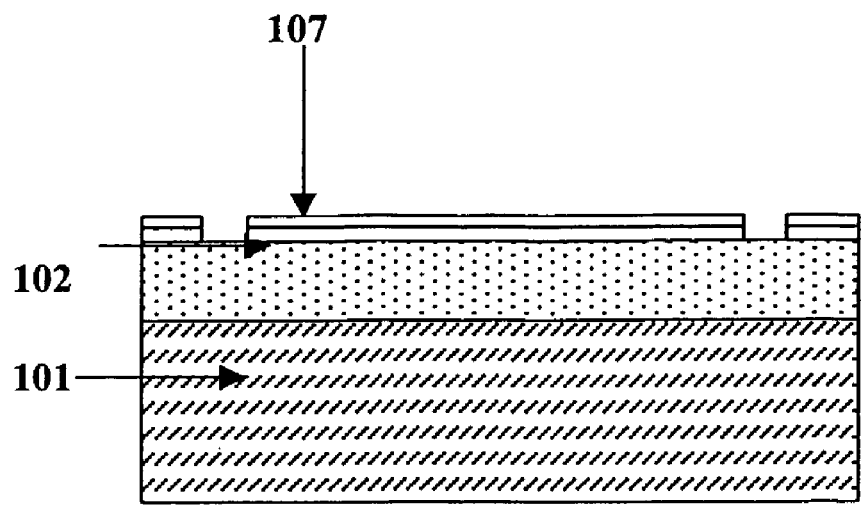
FIG. 3 is a schematic diagram showing the cross-section of the crystallized polycrystalline silicon layer during the MILC process of manufacturing a transflective LCD device.

Next, as seen in FIG. 3, the vertically crystallized region 106 and the patterned masking layer 104 are removed by immersion in a solution containing HF or Buffer Oxidation Etchant (BOE).

Figure 4:
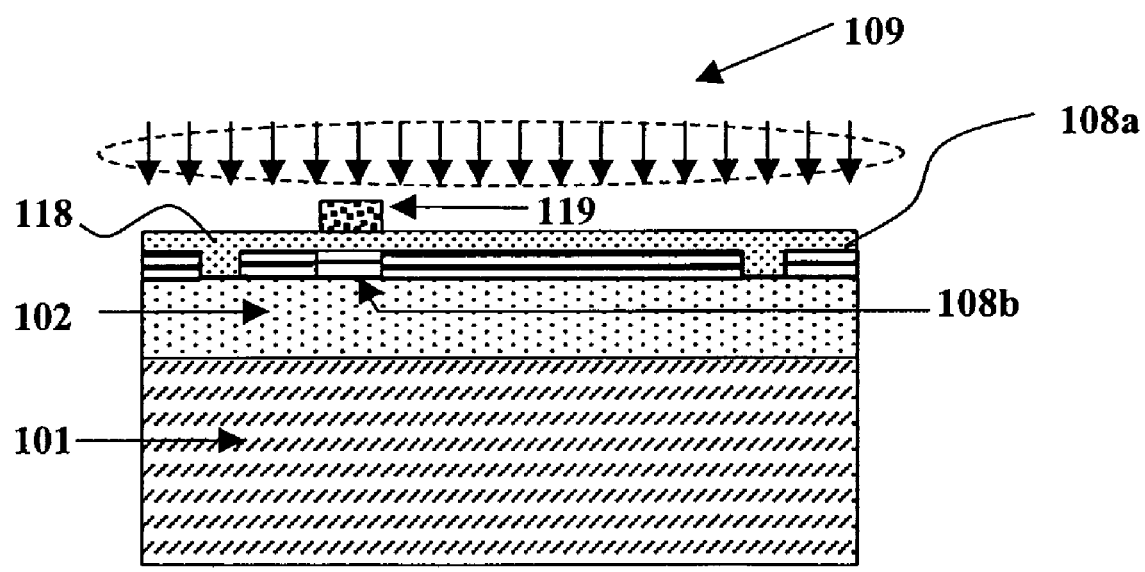
FIG. 4 is a schematic diagram showing the cross-section of a portion of a transflective LCD device and the process of making the same.

As seen in FIG. 4, a gate insulation layer 118 is formed on the MILC poly-Si film, with a gate electrode 119 being formed on the gate insulation layer 118. The MILC poly-Si film is then doped with a resistance-reducing impurity 109, which has been thermally activated, forming a doped region 108a with low resistance and high conductivity. With the gate electrode 119 blocking on the gate insulation layer 118, a portion of the MILC poly-Si film remains as an un-doped region 108b.

Figure 5:
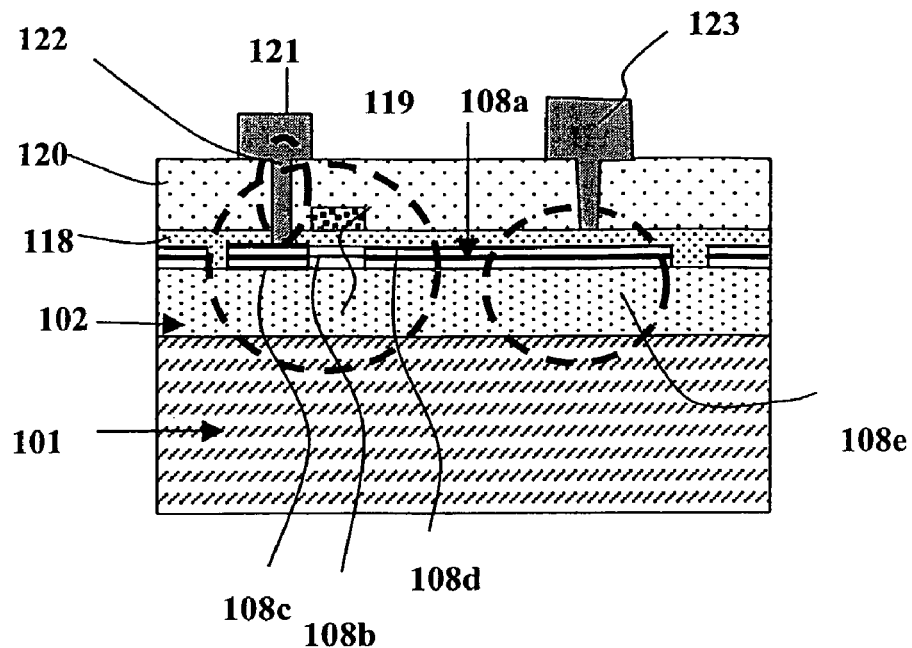
FIG. 5 is a schematic diagram showing the cross-section of a portion of a transflective LCD device and the process of making the same.

Then, as seen in FIG. 5, another insulation layer 120 made of low temperature oxide (LTO) is deposited on the gate insulation layer 118. Two electrode regions 108c 108d (source and drain), and a channel region 108b of a poly-Si TFT are thereby formed. The electrode regions (108c, 108d) and channel regions 108b of the TFT form an active layer of the TFT. The remainder of the doped MILC poly-Si film 108a was used to form a transflective pixel electrode 108e. Such is made possible owing to the conductive and transmissive electrode property of the doped MILC poly-Si. The transflective pixel electrode 108e and the electrode 108d are unitarily formed, resulting in a large aperture ratio. A reflective metal electrode 121 made of aluminum is then formed on the insulation layer 120 and is electrically connected to the electrode 108c as the data line for the TFT. An aluminum mirror 123 for performing display using reflected light is formed at same time. The aluminum mirror 123 is positioned above poly-Si pixel electrode 108e.

Figure 6:
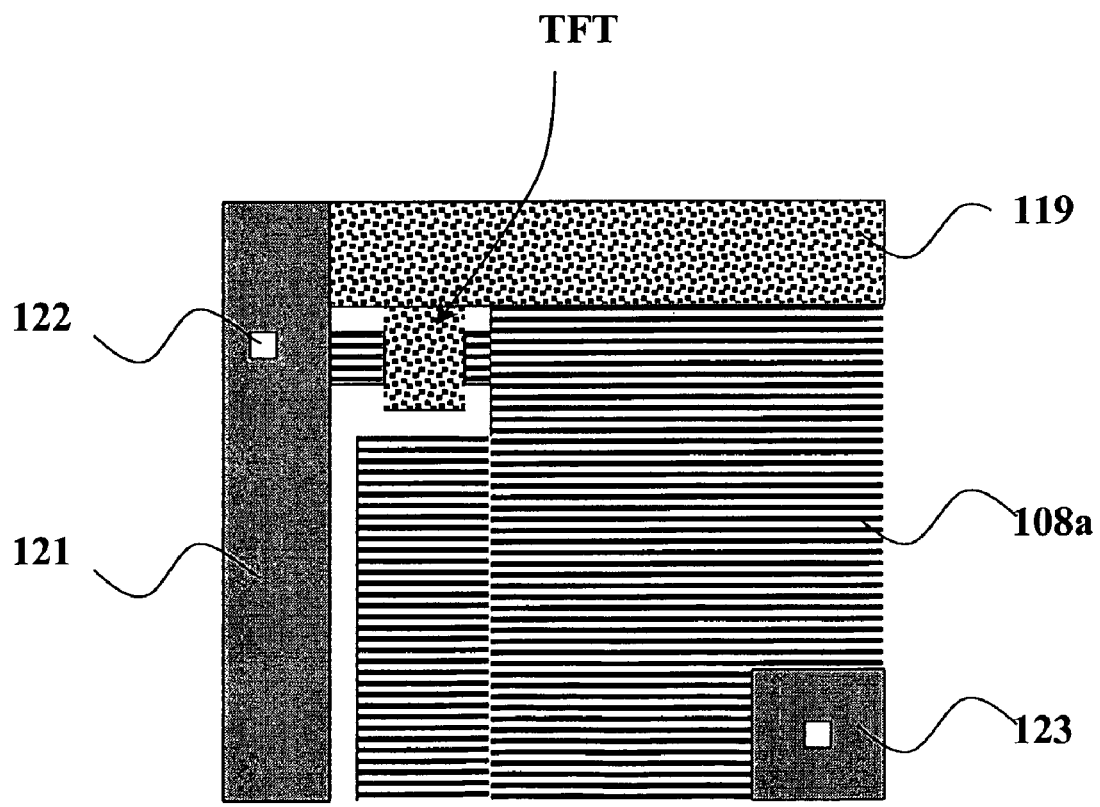
FIG. 6 is a schematic diagram showing the plan-view of a pixel of a transflective LCD device.

FIG. 6 illustrates a plan-view of one pixel of an AMLCD of FIG. 5. The color of the red, green, and blue pixels could be determined by adjusting the area of the mirror 123. A plurality of contact holes 122 are formed on the metal mirror 123 and the metal electrodes 121 to allow the metal electrodes 121 to reach the MILC poly-Si part of the TFT.

Because the pixel electrode 108e and the active layer of the TFT are on the same layer, there is no need to form another electrode layer that is conventionally made of indium tin oxide (ITO). Nor is another pixel pattern mask needed. The active layer of TFT and the pixel electrode are intrinsically in contact with each other.

Non-limiting examples of materials that can be used for the liquid crystal device as described and the properties of the materials are summarized in Table 1.

TABLE 1

| Ref | Name | Composition (%) | Thickness/quantity | Property |
| --- | --- | --- | --- | --- |
| 101 | Insulating substrate | Glass/quartz | 0.1 mm-3 mm | Optical transmission >90% Strain point >600° C. |
| 102 | Buffer layer | SiO2/SiNx | 100 nm-1000 nm | Withstanding >350° C. for extended period of time |
| 103 | Amorphous silicon layer | Silicon 99.9% | 10 nm-3 um | High pure silicon film Uniformity <5% |
| 104 | Patterned masking layer | SiO2/SiNx | 100 nm-300 nm | Withstanding >350° C. for extended period of time |
| 105 | Catalyst for crystallization | Ni, NiSix, Ni(OH)x, NiOx Nickel salt | 1 nm-10 nm | Supper thin, high pure for electron device |
| 106 | Vertically crystallized region | Poly-Si Nickel <10 ppm | 10 nm-3 um | Transformed from 103 |
| 107 | Laterally crystallized region | Poly-Si Nickel <2 ppm | 10 nm-3 um | Transformed from 103 |
| 108 | Resistance-reducing impurity (dopant) | Boron/phosphorus | 4E15/cm$^2$ | Resistance-reducing impurity |

Non-limiting examples of the process and conditions that can be applied for making a portion of a liquid crystal display device as described are summarized in Table 2. The Step number is given for illustrating the steps in Table 2 only and is not related with the reference numerals in the Figures.

TABLE 2

| Step | Description | Process method | Conditions |
| --- | --- | --- | --- |
| 1 | Providing the substrate (101) | Available commercially | — |
| 2 | Forming buffer layer (102) | LPCVD/PEVCVD | 300-450° C. |

TABLE 2-continued

| Step | Description | Process method | Conditions |
|---|---|---|---|
| 3 | Depositing Amorphous silicon film (103) | LPCVD/PEVCVD/ Sputtering | 150-600° C. |
| 4 | Depositing patterned masking layer (104) | LPCVD/PEVCVD | 300-450° C. |
| 5 | Depositing crystallization-inducing catalyst (105) | e-beam/Sputtering/ Solution | 20-50° C. |
| 6 | Forming vertically (106) and laterally (107) crystallized regions | Annealing in $N_2$ | 350-600° C. |
| 7 | Removing the patterned masking layer (104) and vertically crystallized region (106) | HF/BOE Solution Freckle Solution | Room temperature |
| 8 | Adding resistance-reducing impurity (dopant) (108) | Ion implantation/ion shower | Room temperature |
| 9 | Activating the dopant | Rapid thermal process/laser-induced heating/ furnace heating | 450-620° C. |

Figure 7:
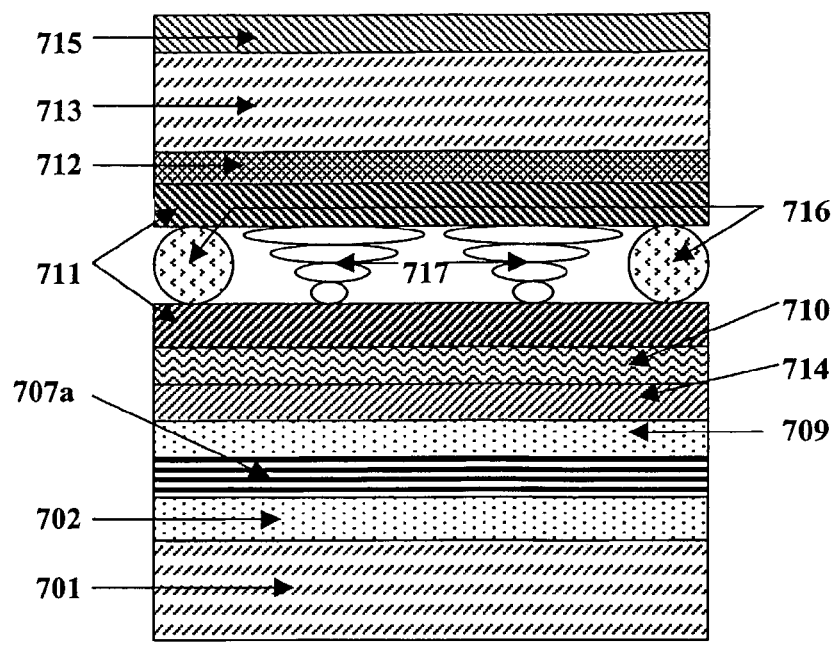
FIG. 7 is a schematic diagram showing a portion of a color active-matrix LCD (AMLCD) cell using the MILC poly-Si LCD device.
Figure 8:
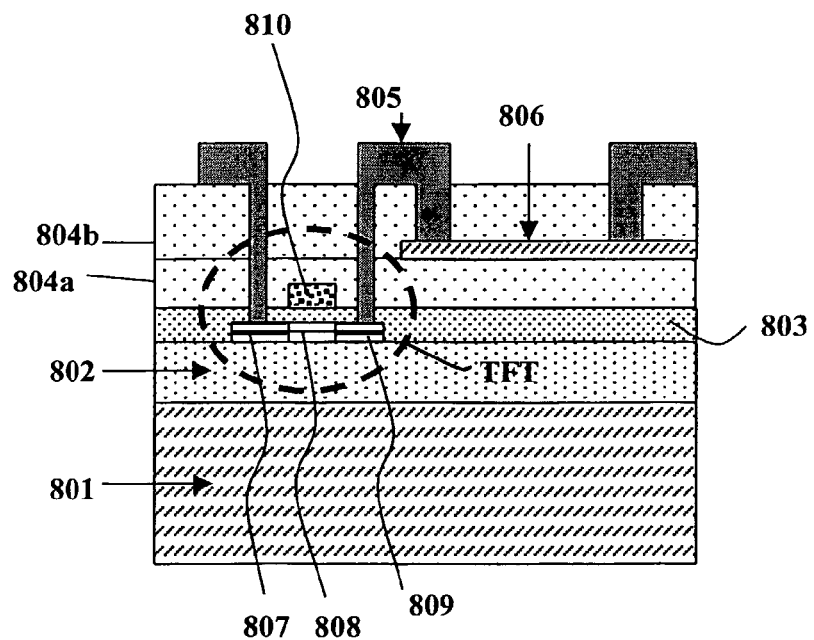
FIG. 8 is a schematic diagram showing the cross-section of a portion of a conventional transflective LCD device.

FIG. 7 illustrates a portion of a color active-matrix liquid crystal display (AMLCD) cell using the MILC poly-Si LCD device as described. The AMLCD cell comprises an insulating substrate 701, on top of which is a buffer layer 702. A MILC poly-Si layer 707a is disposed on the buffer layer 702. The active layer of a TFT (the electrode regions and the channel region) and a pixel electrode as described in FIG. 5 and FIG. 6 are disposed in the MILC poly-Si layer 707a, the details of which are not shown herein. An insulation layer 709 is deposited on the MILC poly-Si layer 707a, on top of which is provided with a bottom polarizer 714. Red, green, and blue color filters 710 are provided on the bottom polarizer 714. Two alignment layers 711 of polyimide are disposed on top of the color filters 710 with a gap. The gap is filled with liquid crystal 717 and spacers 716. An ITO transmission counter electrode 712 is disposed on the top alignment layer. A glass substrate 713 is disposed on the transmission counter electrode 712. A top polarizer 715 is disposed on top of the glass substrate 713.

The average grain size of the MILC poly-Si as produced in the above description is about 50 µm, as measured by Transmission electron microscopy (TEM).

Figure 9:
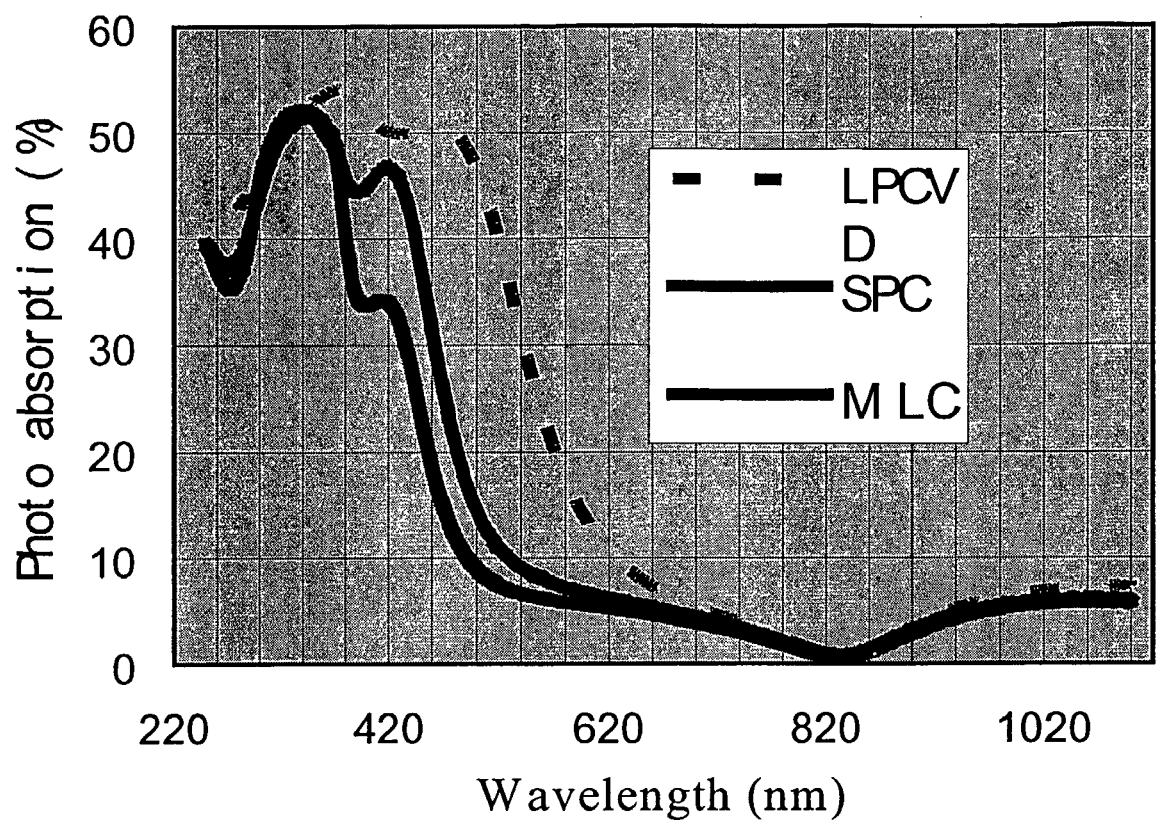
FIG. 9 is a chart showing the photo-absorption curves of LPCVD, SPC and MILC.

FIG. 9 illustrates the comparison of photo absorption ability as measured by Ultraviolet-Visible Spectroscopy (UV-VIS) among three different materials: 1. Poly-Si film formed by Low Pressure Chemical Vapor Deposition (LPCVD); 2. Poly-Si film formed by Solid Phase Crystallization (SPC); 3. Poly-Si film formed by Metal-Induced Lateral Crystallization (MILC). The MILC, SPC and LPCVD Poly-Si films were deposited on a glass substrate (Coring 1737) with a thickness of about 1.1 mm. The photo absorption (%) was measured at a wavelength between 250 nm (ultraviolet) to 1100 nm (infrared). When the wavelength was at 460 nm (blue light), the photo-absorption (%) of MILC, SPC and LPCVD Poly-Si films were 18.4%, 31.5% and 50.5%, respectively. When the wavelength was at 550 nm (green light), the photo-absorptions (%) of MILC, SPC and LPCVD Poly-Si films were 6.4%, 8.5% and 27.2%, respectively. When the wavelength was at 650 nm (red light), the photo-absorptions (%) of MILC, SPC and LPCVD Poly-Si films were 4.8%, 5.6% and 8.5%, respectively. Comparing the photo absorption values, it can be seen that MILC Poly-Si film has lower absorption in the visible light range, which is a better material than SPC and LPCVD Poly-Si films for a pixel electrode in a transflective LCD display. The special forming process and lower grain boundary density of MILC Poly-Si material is the main reason for its lower absorption.

The Sheet resistance of the MILC poly-Si as produced in the above description was about 0.25 KΩ/square, as measured by Four point probes resistivity measurement.

The arrangements, disclosed herein have a number of advantages. First, the replacement of conventional indium-tin oxide by LGLA poly-Si leads to process simplification, with the elimination of (1) deposition and patterning of, and (2) formation of the contact holes, to the traditional indium-tin oxide (ITO) electrode. Ultimately, such replacement results in significant reduction of manufacturing costs.

Although MILC poly-Si has been used as the pixel electrode material in the examples, those skilled in the art should understand that other crystallization methods, such as MIC, MICC, and laser-induced crystallization could also used to produce poly-Si materials having larger grain size, and lower absorption properties as desired.

Generally speaking, the MILC method comprises:
i. depositing a patterned masking layer on said amorphous silicon layer;
ii. depositing crystallization-inducing metal on said masking layer;
iii. crystallizing said amorphous silicon layer, forming metal-induced crystallized (MIC) and MILC poly-Si;
iv. removing said MIC poly-Si and masking layer.

The MIC method comprises:
i. depositing crystallization-inducing metal on said amorphous silicon layer;
ii. crystallizing said amorphous silicon layer, forming metal-induce crystallized poly-Si.

The MICC method comprises:
i. depositing a SiNx cap layer on said amorphous silicon layer;
ii. depositing crystallization-inducing metal on said SiNx layer;
iii. crystallizing said amorphous silicon layer, forming MICC poly-Si.

To form the laser-induced crystallized poly-Si, the amorphous silicon layer deposited on a substrate is irradiated with excimer or solid-state laser, and then subject to a thermal process. Particularly, the irradiation of said amorphous silicon layer was conducted with excimer laser and solid-state second and third harmonic laser.

Methods of forming MILC could be referred from Z. Jin et al. (1998), Z. Meng et al (2000). Methods of MIC could be referred from Toshio Mizuki et al (2004). Methods of MICC could be referred from Jin Jang and Jong Hyun Choi (2005). Laser induced crystallization method could be referred from N. Kubo et al. (1994) and A. Hara et al. (2000).

Example 1

According to the MILC method described in FIG. 1-5, a poly-Si material was produced, which possess a grain size of 50 µm, visible-light absorptivity of 10%, and sheet resistance 0.25 KΩ/square. This poly-Si material was used in the pixel electrode and TFT electrode region in a transflective LCD display and demonstrated satisfying performance.

Example 2

According to the description above, a poly-Si material was produced by the MIC method with the conditions listed in Table 3 below. The poly-Si so produced possesses a grain size of 30 µm, visible-light absorptivity of 12%, and sheet resistance 0.5 KΩ/square. This poly-Si material was used in the pixel electrode and TFT electrode region in a transflective LCD display and demonstrated satisfying performance.

TABLE 3

| Step | Description | Process method | Conditions |
|---|---|---|---|
| 1 | Providing the substrate | Available commercially | — |
| 2 | Forming buffer layer | LPCVD/PEVCVD | 300-450° C. |
| 3 | Depositing Amorphous silicon | LPCVD/PEVCVD/ Sputtering | 150-600° C. |
| 4 | Depositing crystallization-inducing catalyst | Solution | 20-50° C. |
| 5 | Forming poly-Si | Annealing in N2 | 350-600° C. |
| 6 | Adding resistance-reducing impurity (dopant) | Ion implantation/ion shower | Room temperature |
| 7 | Activating the dopant | Rapid thermal process/laser-induced heating/ furnace heating | 450-620° C. |

Example 3

According to the description above, a poly-Si material was produced by the MICC method with the conditions listed in Table 4 below. The poly-Si possesses a grain size of 50 μm, visible-light absorptivity of 10%, and sheet resistance 0.3 KΩ/square. This poly-Si material was used in the pixel electrode and TFT electrode region in a transflective LCD display and demonstrated satisfying performance.

TABLE 4

| Step | Description | Process method | Conditions |
|---|---|---|---|
| 1 | Providing the substrate | Available commercially | — |
| 2 | Forming buffer layer | LPCVD/PEVCVD | 300-450° C. |
| 3 | Depositing Amorphous silicon film | LPCVD/PEVCVD/ Sputtering | 150-600° C. |
| 4 | Depositing SiNx | PECVD | 50-350° C. |
| 5 | Depositing crystallization-inducing catalyst | e-beam/sputtering/ solution | 20-50° C. |
| 6 | Forming LGLA poly-Si | Annealing in $N_2$ | 350-600° C. |
| 7 | Adding resistance-reducing impurity (dopant) | Ion implantation/ion shower | Room temperature |
| 8 | Activating the dopant | Rapid thermal process/laser-induced heating/ furnace heating | 450-620° C. |

Example 4

According to the description above, a poly-Si material was produced by the laser-induced crystallization method with the conditions listed in Table 5 below. The poly-Si possesses a grain size of 0.5-30 μm, visible-light absorptivity of 20-10%, and sheet resistance 0.5-0.3 KΩ/square. This poly-Si material was used in the pixel electrode and TFT electrode region in a transflective LCD display and demonstrated satisfying performance.

TABLE 5

| Step | Description | Process method | Conditions |
|---|---|---|---|
| 1 | Providing the substrate | Available commercially | — |
| 2 | Forming buffer layer | LPCVD/PEVCVD | 300-450° C. |
| 3 | Depositing Amorphous silicon film | LPCVD/PEVCVD/ Sputtering | 150-600 |

TABLE 5-continued

| Step | Description | Process method | Conditions |
|---|---|---|---|
| 4 | Laser crystallization of the amorphous silicon | Excimer laser or solid state harmonic laser irradiation | 20-400° C. |
| 5 | Adding resistance-reducing impurity (dopant) | Ion implantation/ion shower | Room temperature |
| 6 | Activating the dopant | Rapid thermal process/laser-induced heating/ furnace heating | 450-620° C. |

It can be seen from the above examples that poly-Si having grain sizes larger than 0.5 μm, visible-light absorptivity lower than 20%, and sheet resistance lower than 1 KΩ/square could be used to achieve the desired purpose of the present invention.

The grain size, visible-light absorption, and sheet resistance of the poly-Si formed by these methods could be controlled by the dose of nickel in amorphous silicon (a-Si), laser power of one pulse and scan speed, dose of dopant and the thickness of a-Si film. Typical thickness of the (a-Si) layer is 30 nm-50 nm. For best performance, it is desired to control the grain size of the poly-Si at the range of 20-100 μm, the visible-light absorption at 5-20%, and the sheet resistance at 0.1-0.5 KΩ/square The above material, process, and conditions illustrated are non-exhaustive embodiments of the present invention. It should be appreciated by those skilled in the art that changes may be made in these embodiments without departing from the principles and spirit of the invention, the scope of which is defined in the claims and their equivalents.

REFERENCES

A. Hara, F. Takeuchi, and N. Sasaki, "Selective Single-Crystalline-Silicon Growth at the Pro-defined Active Regions of TFTs on a Glass by a Scanning CW Laser Irradiation," 2000 IEEE, IEDM 00, pp. 209-212.

Jin Jang and Jong Hyun Choi "Giant-Grain Silicon (GGS) and its Application to Stable Thin-Film Transistor" IDMC 2005 pp. 146-149.

N. Kubo, N. Kusumoto, T. Inushima, and S. Yamazaki, "Characterization of Polycrystalline-Si Thin Film Transistor Fabricated by Excimer Laser Annealing Method", IEEE Transactions on Electron Devices, Vol. 4, No. 10, October 1994, pp. 1876-1879.

Toshio Mizuki etc. "Large Domains of Continuous Grain Silicon on Glass Substrate for High-Performance TFTs", IEEE Transactions on Electron Devices Vol. 51, No. 2, February 2004. pp. 204-211.

Z. Jin, C. A. Bhat, M. Yueng, H. S. Kwok, and M. Wong, "Nickel induced crystallization of amorphous silicon thin film", Journal of Applied Physics, Vol. 84, No. 7, 1998. pp. 194-200.

Z. Meng, M. Wang, and M. Wong, "High Performance Low Temperature Metal-Induced Unilaterally Crystallized Poly-Crystalline Silicon Thin Film Transistor for System-On-Panel Applications", IEEE Trans, Electron Devices, Vol. 47 No. 2 pp. 404-409, February 2000.

The invention claimed is:

1. A transflective liquid crystal display device comprising:
   a. a first substrate;
   b. a second substrate arranged facing said first substrate with a gap therebetween;
   c. a liquid crystal layer sandwiched in the gap between the first and second substrates;
   d. a partially doped semiconductive poly-Si layer formed on said first substrate, in which a pixel electrode and a portion of a TFT are formed;
   e. a mirror for performing display using reflected light;
   wherein said pixel electrode is electrically connected to said portion of the TFT and wherein said poly-Si has a grain size of 0.5-1000 μm, an average absorptivity of light of 5-20% in the visible light region, and a sheet resistance of 0.01-1 KΩ/square.

2. The liquid crystal display according to claim 1, wherein said poly-Si is selected from MIC, MILC, MICC or laser-induced crystallization poly-Si.

3. The liquid crystal display device according to claim 1, wherein said portion of the TFT comprises two electrode regions of the TFT.

4. The liquid crystal display according to claim 3, further comprising a channel region formed between the two electrode regions.

5. The liquid crystal display according to claim 3, wherein said pixel electrode is unitarily formed with one of the electrode regions of the TFT.

6. The liquid crystal display device according to claim 4, wherein the partially doped poly-Si comprises a doped region and an un-doped region, said pixel electrode and said electrode regions being formed in the doped region and said channel region being formed in the un-doped region.

7. The liquid crystal display according to claim 6, wherein said doped region comprises a resistance-reducing impurity selected from boron, phosphorous or arsenic.

8. The liquid crystal display according to claim 4, further comprising:
   a. an insulation layer disposed on the poly-Si layer, the poly-Si region including the TFT electrode regions and the channel region;
   b. a gate electrode formed above the insulation layer over the channel region;
   c. a metal electrode electrically connected to the active layer of the TFT.

9. The liquid crystal display according to claim 8, wherein said metal electrode is connected to one of the electrode regions of the TFT.

10. The liquid crystal display device according to claim 8, wherein said insulation layer is made of low-temperature oxide and said metal electrode is made of aluminum.

11. A transflective liquid crystal display device comprising
   a. a first substrate, a second substrate comprising and a liquid crystal layer provided between inner surfaces of the first and the second substrates,
   b. a plurality of pixel regions and a plurality of switching elements on the first substrate, each of the pixel regions comprising a reflective region and a transmissive region, wherein the transmissive region comprises a transmissive electrode formed at a location corresponding to the transmissive region of each pixel region, and the reflective region comprises
      i. a mirror for performing display using reflected light;
      ii. a metal electrode;
      iii. pixels of red, green, and blue colors, wherein pixel color is controlled by adjusting the area of the mirror;
   wherein the metal electrode is electrically connected to the switching element and wherein said transmissive electrode includes poly-Si, said poly-Si having a grain size of 0.5-1000 μm, an average absorptivity of 20% or lower, and a sheet resistance of 0.01-1 KΩ/square.

12. The transflective liquid crystal display according to claim 11, wherein said poly-Si has a grain size of 0.5-50 μm, an average absorptivity of 10-20%, and a sheet resistance of 0.1-1 KΩ/square.

13. The transflective liquid crystal display device according to claim 11, wherein said poly-Si is selected from MILC, MIC, MICC, or laser-induced crystallized poly-Si.

14. The transflective liquid crystal display device according to claim 11, wherein said poly-Si is doped with a resistance-reducing impurity selected from a group consisting of boron, arsenic, and phosphorous.

15. A process of making a transflective liquid crystal device, comprising:
   a. providing a first substrate;
   b. depositing an amorphous silicon layer on the substrate;
   c. forming a poly-Si layer from said amorphous silicon layer, said poly-Si having a grain size of about 0.5-1000 μm, an average absorptivity of 20% or lower in the visible light region and a sheet resistance of 0.01-1 KΩ/square;
   d. partially doping the poly-Si layer, forming a doped region and an un-doped region;
   e. forming a portion of a TFT and a pixel electrode in the doped region of the poly-Si layer;
   f. forming a second substrate arranged facing the first substrate with a gap therebetween;
   g. forming a liquid crystal layer in the gap between the first and second substrate.

16. The process according to claim 15, wherein said poly-Si having a grain size of 0.5-50 μm, an average absorptivity of 5-20%, and a sheet resistance of 0.1-1 KΩ/square.

17. The process according to claim 15, wherein said poly-Si is formed by a crystallization method selected from MIC, MILC, MICC, and laser-induced crystallization method.

18. The process according to claim 17, wherein the MILC method comprises:
   i. depositing a patterned masking layer on said amorphous silicon layer;
   ii. depositing crystallization-inducing metal on said masking layer;
   iii. crystallizing said amorphous silicon layer, forming metal-induced crystallized (MIC) and MILC poly-Si;
   iv. removing said MIC poly-Si and masking layer.

19. The process according to claim 15, wherein said doping in step d comprises:
   i. adding a dopant to a portion of the poly-Si;
   ii. activating said dopant by heating at a temperature of 450-620° C., forming a doped region and an un-doped region.

20. The process according to claim 19, wherein step e. comprises forming an electrode region in the doped region and forming a channel region in the un-doped poly-Si region.

21. The process according to claim 15, further comprising depositing a buffer layer on said substrate before depositing the amorphous silicon layer.

22. The process according to claim 21, wherein said amorphous silicon layer, buffer layer and patterned masking layer are deposited via a method selected from a group consisting of LPCVD, PEVCVD, and sputtering.

23. The process according to claim 18, wherein said crystallization-inducing metal is deposited via a method selected from a group consisting of e-beam, sputtering, or immersion in a solution.

24. The process according to claim 18, wherein said crystallization method comprises an annealing step selected from a group consisting of laser annealing, high-temperature annealing (>600° C.), annealing from 350-600° C. and annealing in $N_2$.

25. The process according to claim 18, wherein said crystallization-inducing metal is selected from a group consisting of Ni, $NiSi_x$, $Ni(OH)_x$, $NiO_x$, and Nickel salts.

26. The process according to claim 19, wherein said dopant is added via ion implantation or ion shower.

27. The process according to claim 19, wherein said dopant is a resistance-reducing impurity selected from a group consisting of boron, arsenic, and phosphorous.

28. The process according to claim 21, wherein said buffer layer is made of $SiO_2$ or $SiN_x$.

29. A transflective liquid crystal display device made by
  a. forming a partially doped poly-Si layer on a first substrate, said poly-Si having a grain size of about 0.5-1000 μm, a sheet resistance of 0.01-1 KΩ/square and an average absorptivity of 20% or lower in the visible light region;
  b. forming an electrode region of a TFT and a pixel electrode in the partially doped poly-Si layer;
  c. forming a second substrate arranged facing the first substrate with a gap therebetween;
  d. forming a liquid crystal layer in the gap between the first and second substrate.

30. The transflective liquid crystal display device according to claim 29, wherein said poly-Si has a grain size of about 0.5-50 μm, an average absorptivity of 10-20%, and sheet resistance of 0.1-1 KΩ/square.

* * * * *